United States Patent
Taguchi

(10) Patent No.: US 6,803,124 B2
(45) Date of Patent: Oct. 12, 2004

(54) POLYMER AND LIGHT EMITTING ELEMENT USING THE SAME

(75) Inventor: Toshiki Taguchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 89 days.

(21) Appl. No.: 10/114,261

(22) Filed: Apr. 3, 2002

(65) Prior Publication Data

US 2003/0082405 A1 May 1, 2003

(30) Foreign Application Priority Data

Apr. 3, 2001 (JP) ..................................... P.2001-104579

(51) Int. Cl.⁷ ...................... H05B 33/12; C08F 226/06; C08F 224/00; C08F 212/02
(52) U.S. Cl. ...................... 428/690; 428/917; 428/500; 313/504; 313/506; 257/40; 257/103; 526/259; 526/266; 526/280
(58) Field of Search ................................ 428/690, 917, 428/500, 523; 313/504, 506; 257/40, 102, 103; 252/301.35; 526/258, 259, 260, 266, 280; 528/423

(56) References Cited

U.S. PATENT DOCUMENTS

| | | | |
|---|---|---|---|
| 5,759,709 A | * | 6/1998 | Doi et al. ................... 428/690 |
| 6,399,224 B1 | * | 6/2002 | Li .............................. 428/690 |
| 6,630,254 B2 | * | 10/2003 | Leclerc et al. .............. 428/690 |
| 2001/0019782 A1 | * | 9/2001 | Igarashi et al. ............. 428/690 |
| 2003/0023029 A1 | * | 1/2003 | Wang et al. ................ 528/422 |
| 2003/0091862 A1 | * | 5/2003 | Tokito et al. ............... 428/690 |

FOREIGN PATENT DOCUMENTS

| | | |
|---|---|---|
| JP | 9-255725 | 9/1997 |
| JP | 2000-286056 | 10/2000 |
| WO | WO 96/20253 | * 7/1996 |
| WO | WO 01/49768 | * 7/2001 |

* cited by examiner

*Primary Examiner*—Marie Yamnitzky
(74) *Attorney, Agent, or Firm*—Birch, Stewart, Kolasch & Birch, LLP

(57) ABSTRACT

A polymer represented by the following formula (1):

$$(A_m)_p\text{-}(B_n)_q\text{-}(C_k)_r \qquad (1)$$

wherein A represents a monomer unit comprising one of a pyrrole, a thiophene, a furan, an indole, a carbazole, a benzothiophene, a dibenzothiophene, a benzofuran, a dibenzofuran, an indolizine, a thienothiophene, a thienopyrrole and an isoindole; B represents a monomer unit comprising one of an imidazole, a pyrazole, a pyridazine, a pyrimidine, a pyrazine, an oxazole, a thiazole, an isooxazole, an isothiazole, a triazole, a tetrazole, an oxadiazole, a thiadiazole, and a condensed ring thereof; C represents a monomer unit having a different structure from the monomer units represented by A and B; m and n each independently represents an integer of 1 or more; k represents an integer of 0 or more; p, q and r each independently denotes a mole fraction (%), p and q represent 1 to 99(%), r represents 0–98(%), the sum of p, q and r is 100(%); and at least one of the monomer units A, B and C comprises as a substituent at least one group selected from the group consisting of an alkyl group, an alkoxy group, an ester group, an amide group and a sulfone amide group, each group having 4 to 20 carbon atoms.

17 Claims, No Drawings

POLYMER AND LIGHT EMITTING ELEMENT USING THE SAME

FIELD OF THE INVENTION

The present invention relates to a novel polymer, and a light emitting element containing the polymer, with the excellent high luminance light emission, high light emission efficiency and durability.

BACKGROUND OF THE INVENTION

Recently, study and development have been executed actively on various kinds of display elements. In particular, an organic electroluminescence (EL) element capable of obtaining high luminance light emission with a low voltage has been attracting attention as a prospective display element. For example, an EL element with an organic thin film formed by depositing an organic compound is known (Applied Physics Letters, 51, p. 913-, (1987)) The organic EL element disclosed in the literature has a laminated structure of an electric transporting material and a hole transporting material. It has a dramatically improved light emission characteristic compared with the conventional single layer type elements.

According to the laminated type element, the element is formed by depositing a low molecular organic material as the element material. As a technique for forming the thin film used in the organic EL element, various methods such as a vacuum deposition method as in the above-mentioned literature, a sputtering method, a CVD, a PVD, a coating method using a solvent, or the like can be used. Details thereof are described in the content of some documents. Examples thereof include ORGANIC ELECTROLUMINESCENT MATERIALS AND DEVICES (OPA, Amsterdam, 1997), Organic EL element and Industrialization Front Line Thereof (NTS, 1998), or the like. The present inventor has discussed a method of coating a solution of an organic compound, in particular, an organic polymer material as the thin film forming technique. In the case of the organic polymer material, a thin film can be formed with little defect by the material alone, and the formed thin film can provide characteristics of the excellent physical and chemical fastness.

However, in the case a plurality of materials having various functions such as the electron transporting property, the electron injecting property, the hole transporting property, the hole injecting property and the light emitting property is used for a light emitting element, phase separation, or the like can frequently be generated at the time of mixing the organic polymer materials, and thus it was learned that it is problematic in terms of the performance. Moreover, even in the case of using a low molecular compound mixed with a polymer material, it was learned that it is problematic in terms of the durability.

As an attempt for solving the above-mentioned problem, a method of copolymerizing monomers having various functions is conceivable. However, according to the study and discussion of the present inventor, it was learned that a sufficient performance cannot be obtained by a simple copolymer.

According to a general light emitting element, the light emitting efficiency can be improved by using a hole transporting compound and an electron transporting compound in laminated layers or in the same layer. The present inventor has discussed an element using a plurality of materials in a coating type organic EL element. As to a light emitting element material to be used for a coating type light emitting element, an electron rich hetero aromatic compound such as a pyrrole, a thiophene and a furan is effective as the hole transporting compound. Moreover, an electron deficient hetero aromatic compound containing a plurality of hetero electrons is effective as the electron transporting compound. However, as mentioned above, in the case a plurality of functional materials are used for a light emitting element, it was learned that only a low light emitting performance can be obtained with organic polymer materials. Moreover, in the case a low molecular compound is used as a mixture with a polymer material, it was learned that a problems arises in terms of the durability.

Japanese Patent Application Laid-Open Specification No. 2000-286056 discloses an EL element material containing a carbazole derivative. Japanese Patent Application Laid-Open Specification No. 9-255725/1997 discloses a method for producing an oxadiazolylated polymer usable as an electron transport material of an organic electroluminescent element by selecting a polymer having oxadiazole groups at the side chains.

SUMMARY OF THE INVENTION

A first object of the invention is to provide a novel polymer. A second object is to provide a light emitting element using the same, capable of emitting a light with a high luminance and a good light emitting efficiency, and having the excellent durability.

The invention was achieved by the below-mentioned polymer and light emitting element:

1. A polymer represented by the below-mentioned formula (1):

$$(A_m)_p\text{-}(B_n)_q\text{-}(C_k)_r \qquad (1)$$

(wherein A represents a monomer unit including a pyrrole, a thiophene, a furan and aromatic and hetero aromatic condensed ring derivatives, B represents a monomer unit including a hetero ring derivative containing two or more hetero atoms in a ring system, C represents a monomer unit having a structure other than the above-mentioned, m and n represent an integer of 1 or more, k represents an integer of 0 or more, p and q each denote a mole percentage (%) of 1–99(%), r represents 0–98(%) with the premise that p+q+r=100 (%), and a ballast group having 4 or more carbon atoms is substituted at least in one of the A, B and C monomer units);

2. The polymer according to the above-mentioned item 1, wherein at least one of A in the formula (1) is a monomer unit including a carbazole derivative and at least one of B is a monomer unit including a 1,3,4-oxadiazole derivative;

3. The polymer according to the above-mentioned items 1 to 2, wherein the monomer units in the formula (1) are a vinyl monomer unit;

4. A light emitting element provided by coating at least one or more kinds of polymers between an anode and a cathode, wherein at least one of the polymers contains the polymer according to the above-mentioned items 1 to 3; and 5. The light emitting element according to the above-mentioned items 1 to 4, wherein at least one kind of a light emitting material capable of emitting a light from a triplet exciter is used as a light emitting material.

DETAILED DESCRIPTION OF THE INVENTION

Hereinafter, the invention will be explained in detail. In this specification, "–" represents the range including the numerical values mentioned before and after that each as the minimum value and the maximum value.

First, a polymer represented by the formula (1) will be explained. The terms "the polymer" and "the polymer of the invention" mean a polymer represented by the formula (1) as used hereinafter. The polymer comprises the three monomer units A, B and C. In some cases, r can be 0 (p+q+r=100(%)) so that it is characteristic of a polymer of the invention to always contain the A and B monomer units as the main components. In the invention, the monomer unit denotes a repeating unit.

In the polymer represented by the formula (1), A represents a monomer unit including a pyrrole, a thiophene, a furan and aromatic and hetero aromatic condensed ring derivatives (skeletons). The pyrrole, the thiophene, and the furan are a compound group of a structure group called the electron rich hetero aromatic ring. In the invention, a monomer unit including a derivative (skeletons) thereof is used. As the derivative, a benzo condensation product of a pyrrole, a thiophene and a furan (such as an indole, a carbazole, a benzothiophene, a dibenzothiophene, a benzofuran and a dibenzofuran) can be presented. In addition thereto, an indolizine, a thienothiophene, a thienopyrrole, an isoindole, or the like, can be presented. Among these examples, in the invention, a monomer unit including a pyrrole derivative (skeletons) can be used preferably, and a carbazole (skeleton) can be used particularly preferably.

B represents a monomer unit including a hetero ring derivative containing two or more hetero atoms in a ring system. As the hetero ring, an imidazole, a pyrazole, a pyridazine, a pyrimidine, a pyrazine, an oxazole, a thiazole, an isooxazole, an isothiazole, a triazole, a tetrazole, an oxadiazole, a thiadiazole, or the like, and a condensed ring thereof, can be presented. Among these examples, in the invention, a 1,3,4-oxadiazole derivative (skeleton) can be used particularly preferably.

C represents a monomer unit having a structure other than A and B. As to the polymerization method for a monomer unit at the time of forming a polymer, polymer formation can be carried out according to various kinds of polymerization reactions such as the vinyl polymerization, the condensation polymerization, the ring closure polymerization and the aryl coupling polymerization. In the invention, the polymer formation reaction by the polymerization of the vinyl polymerizable monomers is particularly preferable. As a monomer unit for C, a vinyl polymerizable monomer (such as a styrene, an ester acrylate, an ester methacrylate, a vinyl ether and a substituted allyl) is preferable.

In a polymer of the invention, one with a ballast group having 4 or more carbon atoms substituted in at least one monomer unit of A, B and C can be used preferably. The ballast group denotes an oil soluble group having 4 or more carbon atoms. It is introduced for making a polymer of the invention soluble in an organic solvent (both of non-halogen type solvent and halogen type solvent). As the ballast group, an alkyl group, an alkoxy group (—OR), an ester group (—COOR'; R' represents an alkyl group having 3 to 20 carbon atoms), an amide group (—NR—COR"), a sulfone amide group (—NR—SO$_2$R"—), or the like can be presented (R and R" independently represents an alkyl group; total carbon atoms of the sum of R+R" in an amide group and an sulfone amide group is 4 or more). Moreover, the case with these having two or more connectors and coupled with each other is included as well. As the ballast group used in the invention, an alkyl group and an alkoxy group can be used preferably. The number of atoms thereof is 4 or more, preferably 8 or more and 20 or less. Either one having a straight chain form, or one having a branched form can be used.

A polymer of the invention can be dissolved in non-halogen type solvent (e.g. toluene and other various organic solvent containing non-halogen atom) so that the polymer comprises a ballast group at least one of the monomer unit or the group bonded the main chain of the polymer. However in case of using EL element material comprising a carbazole derivative without a ballast group, the light emitting element comprising the carbazole derivative by coating with non-halogen type solvent has many problems (e.g., defect on the emitting surface of the element, low luminance, a low light emitting efficiency and poor durability). An EL element material comprising the carbazole derivative has poor solubility with non-halogen type solvent. Therefore a light emitting element of the invention has a high luminance, a high light emitting efficiency and durability due to containing a polymer having a ballast group of the invention.

In the formula (1), m and n represent an integer of 1 or more, and k represents an integer of 0 or more; p, q and r each denote a mole fraction (%); p and q independently represents 1–99 (from 1 to 99)(%), r represents 0–98(%); and p+q+r=100(%).

It is preferable that m is 1–3, n is 1–3 and k is 0–2. It is further preferable that m is 1–2, n is 1–2 and k is 0. It is preferable that p is 20–95, q is 1–50 and r is 0–40. It is further preferable that p is 50–95, q is 5–50 and r is 0.

As a monomer unit of the invention, in addition to the ballast group, various kinds of substituents can be used. Examples thereof include a halogen atom (such as a fluorine atom, a chlorine atom, a boron atom and an iodine atom), a cyano group, a formyl group, or a substituted or unsubstituted alkyl group (preferably one having 1–30 carbon atoms, more preferably 1–15 carbon atoms, such as a methyl group, a t-butyl group, and a cyclohexyl group), an alkenyl group (preferably one having 2–30 carbon atoms, more preferably 2–15 carbon atoms, such as a vinyl group, a 1-propenyl group, a 1-butene-2-yl group and a cyclohexene-1-yl group), an alkynyl group (preferably one having 2–30 carbon atoms, more preferably 2–15 carbon atoms, such as an ethynyl group and a 1-propynyl group), an aryl group (preferably one having 6–30 carbon atoms, more preferably 6–15 carbon atoms, such as a phenyl group, a tolyl group, a xylyl group, a naphthyl group, a biphenylyl group and a pyrenyl group), a hetero ring group (preferably a 5 or 6 membered ring, which may be condensed with another ring). As the hetero atom of the hetero ring group, for example, a nitrogen atom, an oxygen atom and a sulfur atom can be used. The hetero ring group preferably has 2–30 carbon atoms, more preferably 2–15 carbon atoms and include a pyridyl group, a piperidyl group, an oxazolyl group, an oxadiazolyl group, a tetra hydrofuril group and a thienyl group, or the like can be presented.

Examples of substituents for the monomer unit of the invention further include primary to tertiary amino groups (such as an amino group, an alkyl amino group, an aryl amino group, a dialkyl amino group, a diaryl amino group, an alkyl aryl amino group, a hetero ring amino group and a bis hetero ring amino group. It is preferably a tertiary amino group having 1–30 carbon atoms, preferably 1–16 carbon atoms. For example, a dimethyl amino group, a diphenyl amino group, a phenyl naphthyl amino group, or the like can be presented.

Examples of substituents for the monomer unit of the invention further include an imino group (a group represented by —CR$_{11}$=NR$_{12}$ or —N=CR$_{13}$R$_{14}$) or the like can be presented. Here, R$_{11}$–R$_{14}$ are each individually selected from the group consisting of a hydrogen atom, an alkyl group, an aryl group, a hetero ring group, an alkoxy group, an aryloxy group, and primary to tertiary amino groups. When any one of R$_{11}$–R$_{14}$ are an alkyl group, an aryl group, a hetero ring group, an alkoxy group, an aryloxy group, and primary to tertiary amino group, the group preferably has 1–30 carbon atoms, more preferably 1–15 carbon atoms. The alkoxy group preferably has 1–30 carbon atoms, more preferably 1–15 carbon atoms. Examples of the alkoxy group include a methoxy group, an ethoxy group, a cyclohexyloxy group, or the like can be presented. The aryloxy group preferably has 6–30 carbon atoms, more preferably 6–15 carbon atoms. Examples of which include a phenoxy group, a 1-naphthoxy group, a 4-phenyl phenoxy group, or the like.

Additional possible substituents on the monomer units include an alkyl thio group (having preferably 1–30 carbon atoms, more preferably 1–15 carbon atoms) such as a methyl thio group, an ethyl thio group, a cyclo hexyl thio group, or the like can be presented; an aryl thio group (preferably having 6–30 carbon atoms, more preferably 6–15 carbon atoms) such as a phenyl thio group, a tolyl thio group, or the like can be presented; a carbon amide group (preferably having 1–30 carbon atoms, more preferably 1–15 carbon atoms) such as an aceto amide group, a benzoyl amide group, an N-methyl benzoyl amide group, or the like can be presented; a sulfone amide group (preferably having 1–30 carbon atoms, more preferably 1–15 carbon atoms) such as a methane sulfone amide group, a benzene sulfone amide group, a p-toluene sulfone amide group, or the like can be presented; a carbamoyl group, (preferably having 1–30 carbon atoms, more preferably 1–15 carbon atoms) such as an unsubstituted carbamoyl group, a methyl carbamoyl group, a dimethyl carbamoyl group, a phenyl carbamoyl group, a diphenyl carbamoyl group, a dioctyl carbamoyl group, or the like can be presented; a sulfamoyl group (preferably having 1–30 carbon atoms, more preferably 1–15 carbon atoms) such as an unsubstituted sulfamoyl group, a methyl sulfamoyl group, a dimethyl sulfamoyl group, a phenyl sulfamoyl group, a diphenyl sulfamoyl group, a dioctyl sulfamoyl group, or the like can be presented; an alkyl carbonyl group (preferably having 1–30 carbon atoms, more preferably 1–15 carbon atoms) such as an acetyl group, a propionyl group, a butyloyl group, a lauroyl group, or the like can be presented; an aryl carbonyl group (preferably having 6–30 carbon atoms, more preferably 6–15 carbon atoms) such as a benzoyl group, a naphthoyl group, or the like can be presented; an alkyl sulfonyl group (preferably having 1–309 carbon atoms, more preferably 1–15 carbon atoms) such as a methane sulfonyl group, an ethane sulfonyl group, or the like can be presented; an aryl sulfonyl group (preferably having 6–30 carbon atoms, more preferably 6–15 carbon atoms) such as a benzene sulfonyl group, a p-toluene sulfonyl group, a 1-naphthalene sulfonyl group, or the like can be presented; an alkoxy carbonyl group (preferably having 1–30 carbon atoms, more preferably 1–15 carbon atoms) such as a methoxy carbonyl group, an ethoxy carbonyl group, a butoxy carbonyl group or the like can be presented; an aryloxy carbonyl group (preferably having 6–30 carbon atoms, more preferably 6–15 carbon atoms) such as a phenoxy carbonyl group, a 1-naphthoxy carbonyl group, or the like can be presented; an alkyl carbonyloxy group (preferably having 1–30 carbon atoms, more preferably 1–15 carbon atoms) such as an acetoxy group, a propionyloxy group, a butyloyloxy group, or the like can be presented; an aryl carbonyloxy group (preferably having 6–30 carbon atoms, more preferably 6–15 carbon atoms) such as a benzoyloxy group, a 1-naphthoyloxy group, or the like can be presented; a urethane group (preferably having 1–30 carbon atoms, more preferably 1–15 carbon atoms) such as a methoxy carbon amide group, a phenoxy carbon amide group, a methyl amino carbon amide group, or the like can be presented; a ureido group (preferably having 1–30 carbon atoms, more preferably 1–15 carbon atoms) such as a methyl amino carbon amide group, a dimethyl amino carbon amide group, a diphenyl amino carbon amide group, or the like can be presented; an ester carbonate group (preferably having 1–30 carbon atoms, more preferably 1–15 carbon atoms) such as a methoxy carbonyloxy group, a phenoxy carbonyloxy group or the like can be presented; or the like.

In a preferred embodiment, the polymer of the formula (1) corresponds to the following formula (2):

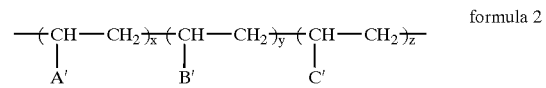

formula 2 at least one of the A' represents carbazole; B' represents the partial structure comprising 1,3,4-oxadiazole skeleton; C' represents a group having a structure other than A and B. X, y and z each represents mole fraction (%), x and y each represents 1–99(%), z represents 1–98(%), x+y+z=100(%); and at least one of the A', B' and C' comprises as a substituent at least one group selected from the group consisting of an alkyl group, an alkoxy group, an ester group, an amide group and a sulfone amide group, each group having 4 to 20 carbon atoms.

In formula (2), A' represents carbazole group bonded with the main chain of the polymer. The carbazole group is preferably bonded with main chain of the polymer at any position from the 1-position to the 9-position, preferably the 9-position (the position of nitrogen atom of carbazole). B' represents the partial structure comprising 1,3,4-oxadiazole skeleton. The 1,3,4-oxadiazole skeleton is preferred as following structure:

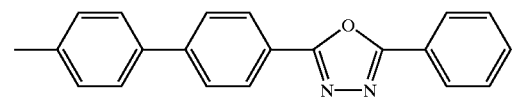

In formula (2), z is preferably 0. The preferred range of a ballast group and other substituent are same as formula (1).

Hereinafter, specific examples of preferable monomer units, and specific synthesis reaction examples will be shown with routes, however, the invention is not limited thereto.

A-1

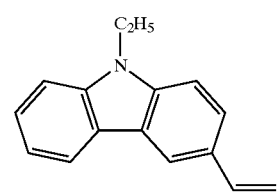

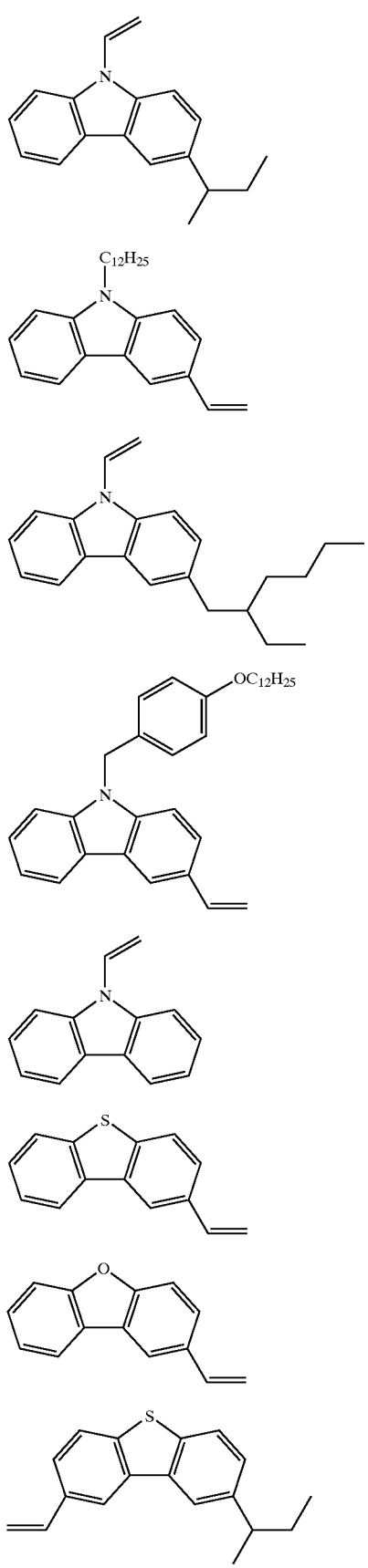
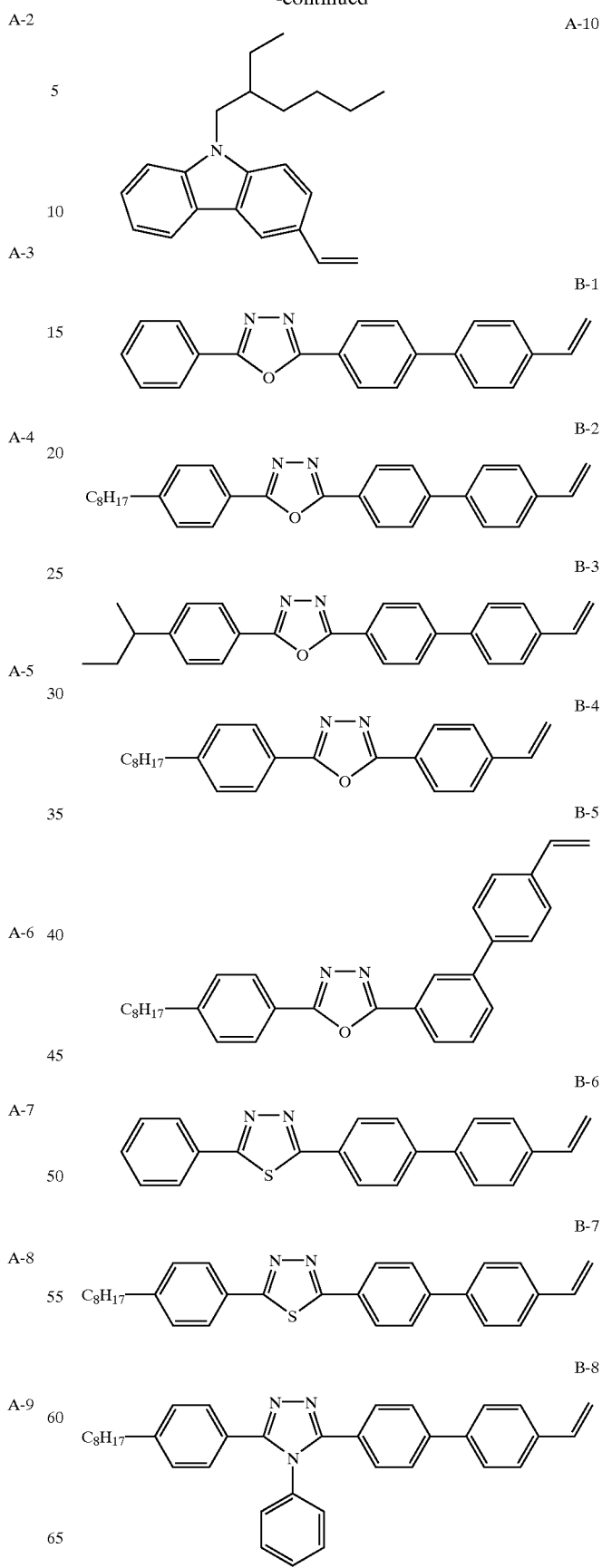

-continued
B-9
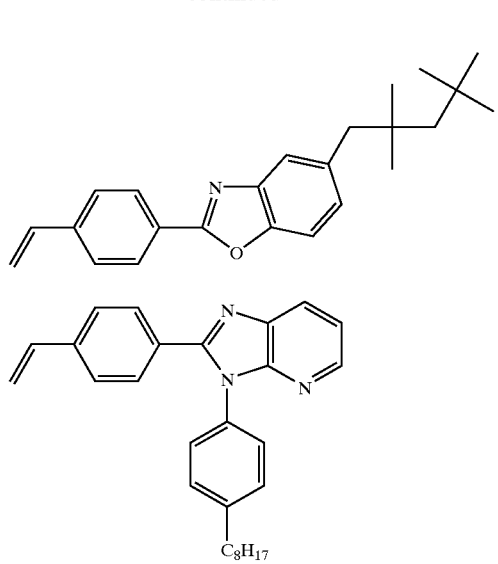
B-10
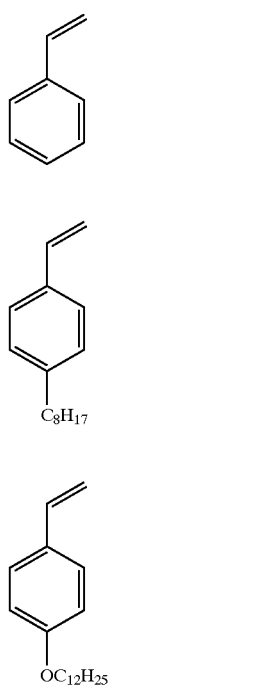
C-1
C-2
C-3
C-4
C-5
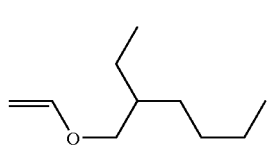
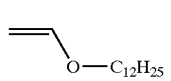
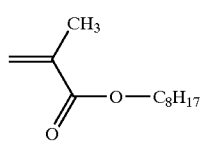
-continued
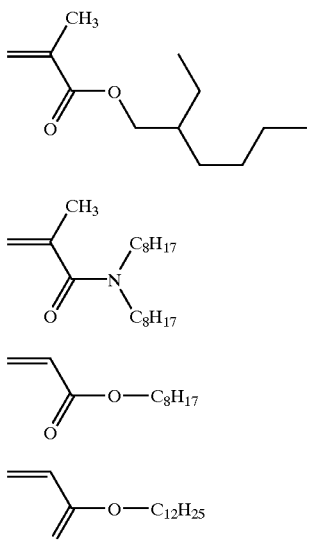
C-7
C-8
C-9
C-10
(Specific synthesis method for a monomer)
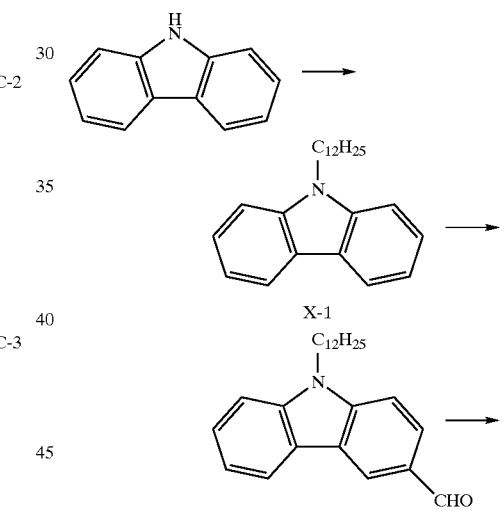
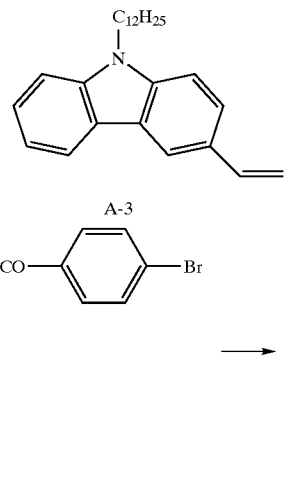
C-6

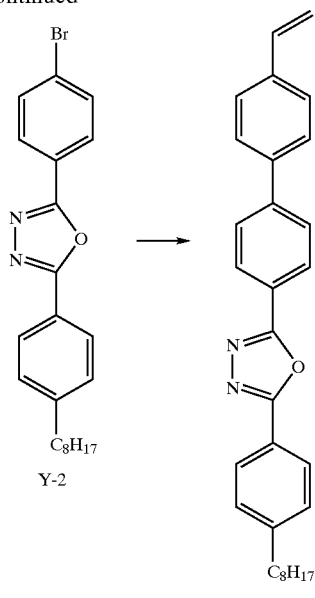

Y-2

B-2

1) Synthesis of a Monomer A-3
(Synthesis of a compound X-1)

50.1 g (0.3 mol) of a carbazole, 77 g (0.31 mol) of a 1-bromododecane, 250 ml of a toluene, 18 g (0.31 mol) of a potassium hydroxide, 5 g of a tetra-n-butyl ammonium bromide and 100 ml of water were placed in a 1,000 ml three neck flask with a thermometer and a flux condenser attached. While agitating the content using a magnetic agitator, reaction was carried out for 5 hours under a reflux condition. After the reaction, the water phase was eliminated, and the toluene phase was washed with 200 ml water for two times. After eliminating the water phase, drying the toluene phase with a magnesium sulfate anhydride and filtration, the solvent was eliminated with the filtrated liquid under a reduced pressure so as to deposit a solid matter. The crystal was recrystallized from an ethanol so as to obtain 92 g of a crystal of a compound X-1.

(Synthesis of a Compound X-2)

150 ml of an N,N-dimethyl formamide (DMF) was placed in a 1,000 ml three neck flask with a thermometer and a flux condenser attached. While agitating the same using a magnetic agitator, an ice-methanol bath was attached thereto for lowering the inner temperature to −10° C. 47 g (0.13 mol) of a phosphorus oxychloride was dropped gradually thereto such that the inner temperature does not exceed 0° C. After finishing the dropping operation, agitation was continued for about 15 minutes in this state. Thereafter, a solution prepared by dissolving 101 g (0.3 mol) of the crystal of the compound X-1 in 200 ml of a DMF was dropped gradually thereto. After finishing the dropping operation, reaction was carried out for about 30 minutes while agitating under a room temperature condition. After raising the temperature to 80° C. with a hot water bath further attached, the reaction was carried out for further 3 hours. After finishing the reaction, the reaction mixture was poured into 3 liters of cold water so as to have a crystal deposited. The crystal was filtrated, and recrystallized from a solvent mixture of an ethanol and water so as to obtain 97 g of a crystal of a compound X-2.

(Synthesis of a Monomer A-3)

72.6 g (0.2 mol) of the compound X-2, 5 g of a 2,6-di-t-butyl-r-methyl phenol as a polymerization inhibitor, 71.5 g (0.2 mol) of a triphenyl methyl phosphonium bromide and 400 ml of an N,N-dimethyl formamide were placed in a 1,000 ml three neck flask with a thermometer and a flux condenser attached. While agitating the same using a magnetic agitator, an ice-methanol bath was attached thereto for lowering the inner temperature to 0° C. 0.2 mol equivalent of an methanol solution of a 28% by mass sodium methoxide was dropped thereto over 10 minutes. After finishing the dropping operation, the cooling bath was removed so as to be in a room temperature condition. Agitation was continued further for about 3 hours in this state. After finishing the reaction, the reaction mixture was poured into 3 liters of cold water so as to have a crystal deposited. The crystal was filtrated, and separation was carried out using an elution liquid of an n-hexane/ethyl acetate=4/1 volume mixture ratio in a silica gel chromatography so as to obtain 66 g of a crystal of a monomer A-3.

2) Synthesis of a Monomer B-2
(Synthesis of a Compound Y-1)

117 g (0.5 mol) of a 4-benzoic octylate, 400 ml of an ethyl acetate and one drop of a DMF as a catalyst were placed in a 1,000 ml three neck flask with a thermometer and a flux condenser attached. While agitating the content using a magnetic agitator, the inner temperature was maintained at 50° C. using a hot water bath. 127 g (1.0 mol) of an oxalyl chloride was dropped gradually thereto so that reaction took place with a gas generated violently. After finishing the dropping operation, reaction was further continued at this temperature. After the reaction for about 2 hours, the gas generation was hardly observed. With the reflux condenser removed and a tool for a reduced pressure distillation via a trap attached, all the volatile component was eliminated using an aspirator. Accordingly, a 4-octyl benzoyl chloride was synthesized.

Independently therefrom, 107.6 g (0.5 mol) of a 4-bromo benzhydrazide and 800 ml of an N,N-dimethyl aceto amide were placed in a 2,000 ml three neck flask with a thermometer and a flux condenser attached. While agitating the content using a magnetic agitator, an ice-methanol bath was attached thereto for lowering the inner temperature to 0° C. The total amount of the above-mentioned synthesized 4-octyl benzoyl chloride was dropped gradually thereto such that the inner temperature does not exceed 20° C. Reaction took place instantaneously exothermically so that an insoluble white crystal was deposited. After finishing the dropping operation, the reaction was carried out for further 30 minutes in a room temperature. After finishing the reaction, 600 ml of an aceto nitrile was added so as to completely deposit the crystal of the product. The deposited crystal was filtrated under a reduced pressure using a Nutsche. The crystal was washed with an aceto nitrile so as to obtain 201 g of a crystal of a compound Y-1.

(Synthesis of a Compound Y-2)

200 g of a crystal of the compound Y-1 and 1,000 g of a polyphosphoric acid were placed in a 2,000 ml three neck flask with a thermometer and a flux condenser attached so as to be heated using an oil bath. Initially, the content was thickened, however, it was provided with a flowability when the inner temperature exceeds about 100° C. While agitating the mixture using an agitating spring, reaction was carried out for 5 hours under a 160–180° C. inner temperature condition. After finishing the reaction, when the inner temperature was lowered to about 100° C., the content was poured into cold water. With the temperature rise, a white crystal was deposited. The crystal was recrystallized from an ethanol so as to obtain 159 g of a crystal of a compound Y-2.

(Synthesis of a Monomer B-2)

124 g (0.3 mol) of the compound Y-2, 7 g of a 2,6-di-t-butyl-4-methyl phenol as a polymerization inhibitor, 1 g of a triphenyl phosphine, 5 g of a 10% by mass palladium supporting active carbon catalyst, 74 g (0.5 mol) of a 4-phenyl boronic acid, 106 g (1.0 mol) of a sodium carbonate, 500 ml of a diethylene glycol dimethyl ether and 100 ml of water were placed in a 2,000 ml three neck flask with a thermometer and a flux condenser attached. While agitating the same using an agitating spring, reaction was carried out for 5 hours under a reflux condition. After finishing the reaction, 500 ml of a diethylene glycol dimethyl ether was further added thereto. By filtrating the same under a reduced pressure using a Nutsche with a thermal cellite placed, the catalyst was filtrated. Since the crystal of a product is deposited by adding 1 liter of a methanol to the filtrated liquid, it was filtrated after cooling. The coarse crystal was recrystallized from a solvent mixture of an ethyl acetate/ethanol so as to obtain 127 g of a crystal of a monomer B-2.

Furthermore, specific examples of a polymer compound (polymer preferably used in the invention) to be formed by the above-mentioned polymerization reaction of monomers will be presented below. The invention is not limited to the specific examples. In the chemical structure formulae presented below, the numerals on the right downward side of the parentheses of the polymer principal chain part denote a mole percentage (%). In the case the numeral is not shown, it denotes 100% that is, 1.

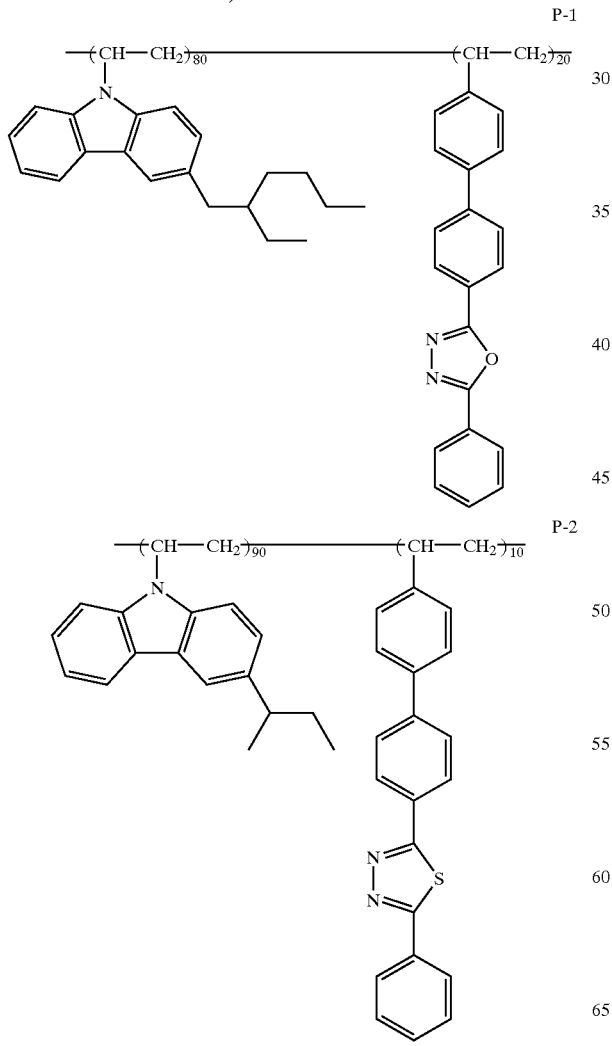

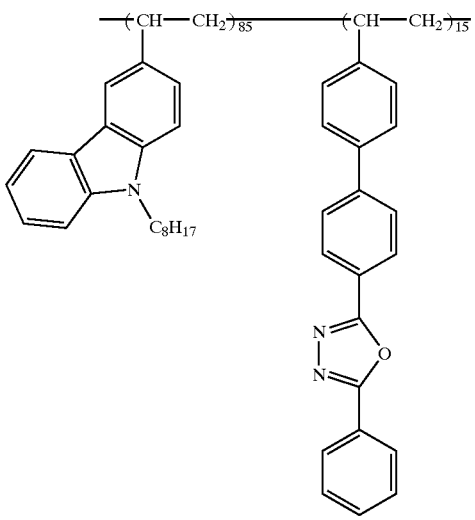

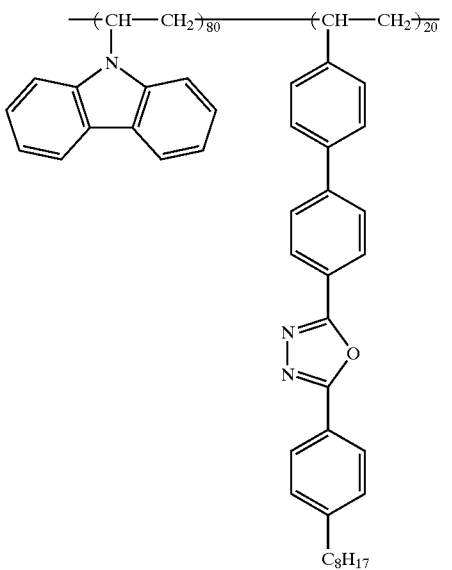

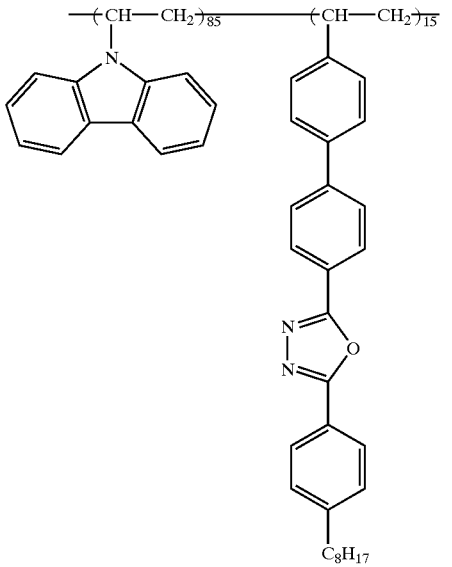

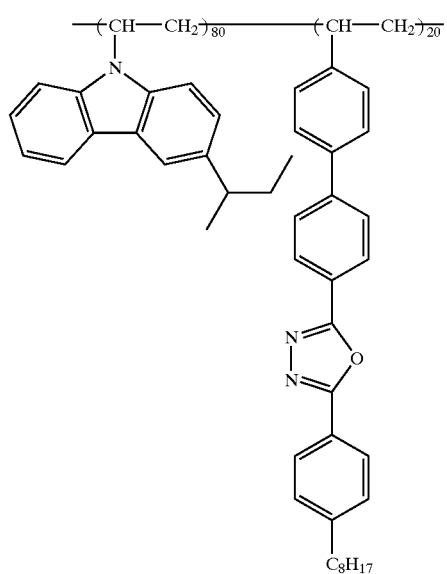
P-6
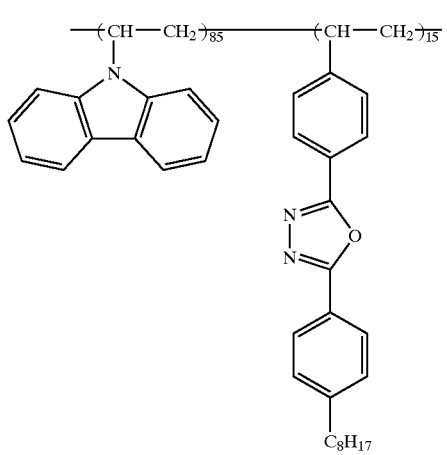
P-7
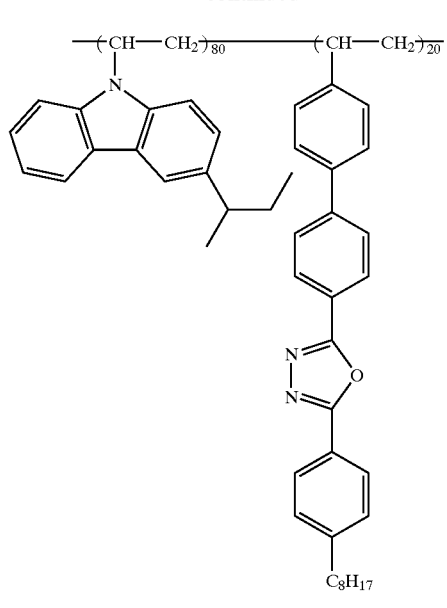
P-8
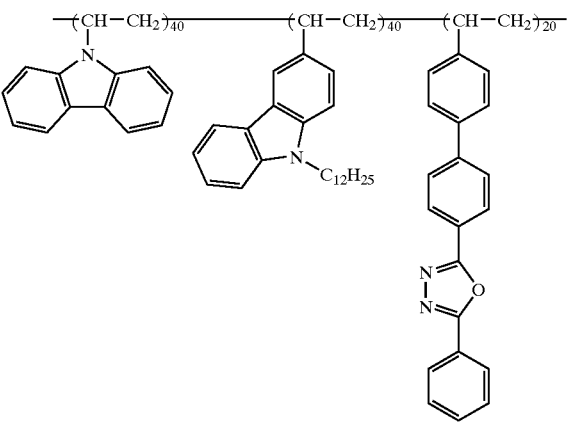
P-9
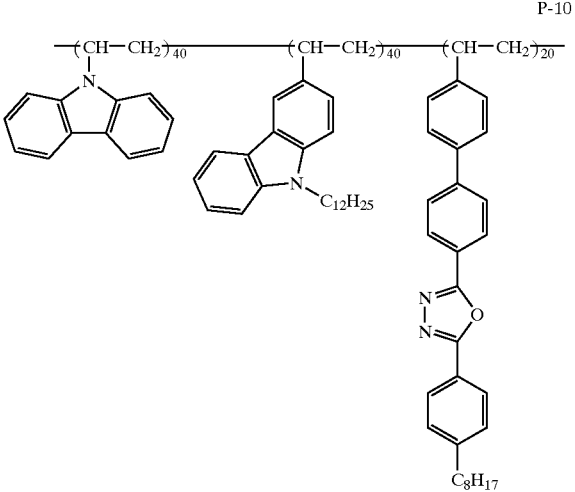
P-10
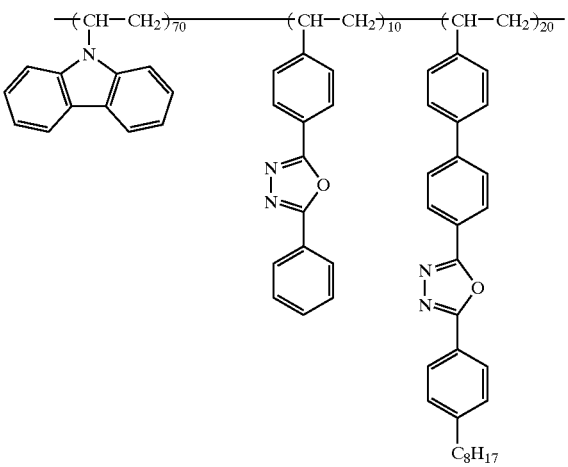
P-11

-continued

P-12

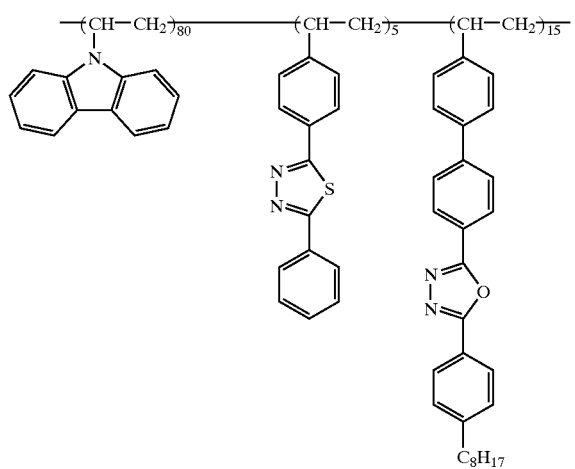

P-13

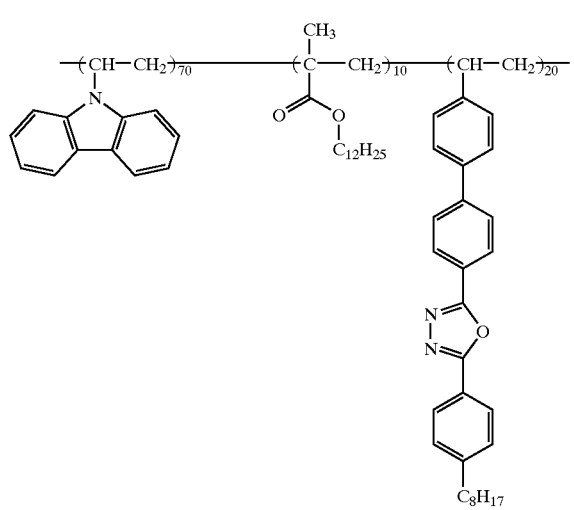

P-14

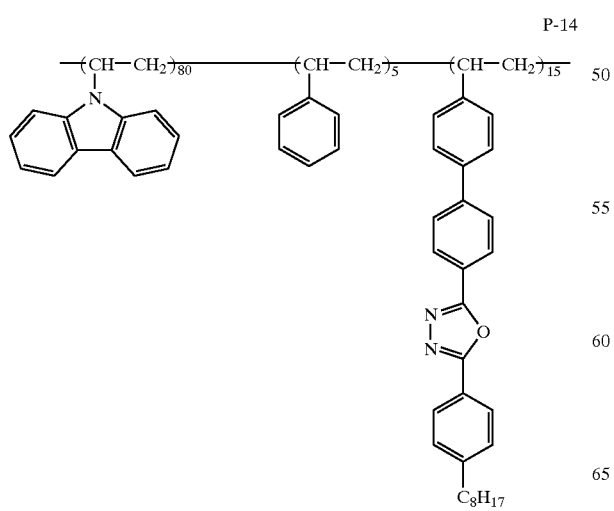

(Specific Synthesis Method for a Polymer)

P-5

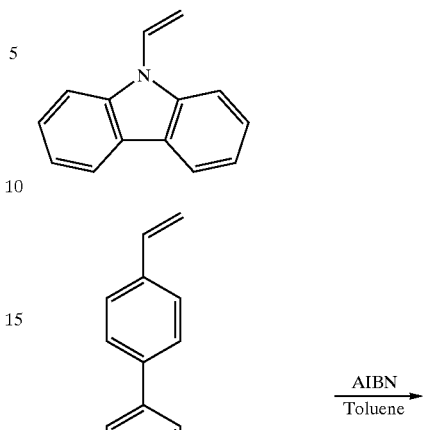

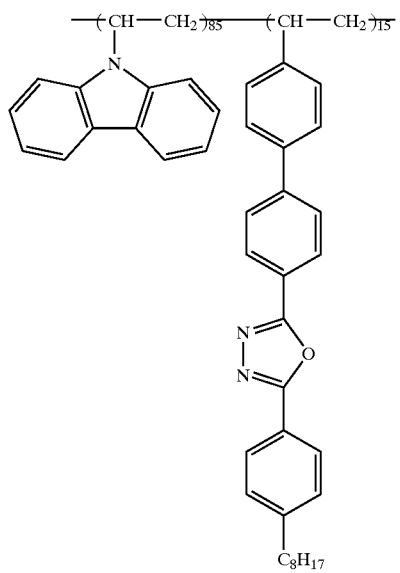

(Synthesis of a Polymer P-1)

15.5 g (0.08 mol) of an N-vinyl carbazole, 8.72 g (0.02 mol) of the monomer B-2 and 150 ml of a toluene were placed in a 500 ml three neck flask with a thermometer, a gas introducing tube and a flux condenser attached, and a nitrogen air flow was provided therein. While agitating the content using a magnetic agitator, the inner temperature was controlled at 70° C. Each 0.1 g of an azo bis isobutylonitrile was added thereto as an initiator 5 times with a 1 hour interval. After continuing the polymerization reaction for further 3 hours after finishing the addition, it was confirmed that all the monomers were vanished by a TLC plate check. After filtration, the polymer solution was poured into 3 liters of an ethanol for precipitation refining. The deposited polymer was filtrated and dried. Accordingly, 22.9 g of a flake-like solid polymer P-5.

A polymer to be used in the invention can be introduced to the polymer by a polymerization method such as the radical polymerization, the ion polymerization, the condensation polymerization and the ring closure polymerization. In particular, a polymer obtained by the vinyl polymerization such as the radical polymerization and the ion polymerization can be used preferably. For the polymerization method, details are disclosed in "Experimental Method for Polymer Synthesis" written by Otsu and Kinoshita published by Kagaku Dojin (1972). The mass average molecular weight (Mw) of a polymer produced by the synthesis is 1,000–10,000,000, preferably 2,000–100,000, particularly preferably 5,000–500,000. Moreover, a polymer of the invention can be used as an organic light emitting element material in combination with another organic material or inorganic material. As the organic material to be used in a combination, a low molecular organic material or a polymer may be used as well.

A polymer synthesized with a monomer of the present invention as the organic light emitting element material can be used as a host material, a hole injecting material, a hole transporting material, a light emitting material, an electron transporting material, or an electron injecting material. The polymer of the invention can be used as a host material and charge injecting and transporting material both.

A polymer used in the invention can be used alone or as a mixture with another polymer. Furthermore, it can be used as a mixture with a low molecular compound.

The invention is to provide a production method for a light emitting element provided with a light emitting material as a thin film in one or more layers between an anode and a cathode. Preferably the thin film comprises two or more layers. In particular, it relates to a production method for an organic light emitting element using an organic substance as a light emitting element material. According to a method of the invention, the function of the light emitting element material can be improved by coating an element material of two or more layers and applying a physical or chemical post treatment thereto so as to modify the coated thin film element material.

As the light emitting element material, any material used as a light emitting element material, such as a hole injecting material, a hole transporting material, a hole blocking material, an electron injecting material, an electron transporting material, an electron blocking material and a light emitting material can be used. In the invention, an organic compound can be used preferably as the above-mentioned various light emitting element materials.

In the case a polymer of the invention is used as the organic light emitting element material, the organic light emitting element can be used in any light emitting material, such as one for emitting a light from a singlet exciter, one for emitting a light from a triplet exciter (phosphorescence light emitting compound) and one emitting a light from both of them. In particular, a combination with a light emitting material including the light emission from a triplet exciter can be used preferably in terms of the light emitting efficiency.

As a light emitting material used in the invention, at least one selected from the group consisting of an ortho-metalation metal complex and a porphyrin metal complex as a phosphorescence light emitting compound can be used preferably, and an ortho-metalation metal complex can be used more preferably.

The ortho-metalation metal complex used in the invention will be explained. The ortho-metalation metal complex is the general term for a compound group disclosed in for example, "Organic Metal Chemistry—Basic and Application—" p150, 232 published by Shokabosha, written by Akio Yamamoto, published in 1982, "Photochemistry and Photophysics of coordination compounds" p71–p77, p135–p146 Springer-Verlag Corp., written by H. Yersin, published in 1987, or the like. As the central metal for the metal complex, any transitional metal can be used. In the invention, in particular, a rhodium, a platinum, a gold, an iridium, a ruthenium, a palladium, or the like can be used preferable. Among these examples, an iridium is more preferable. Specific description of the ortho-metalation metal complex and compound examples are disclosed in the paragraph numbers 0152 to 0180 in the official gazette of JP-A-2000-254171 (the term "JP-A" as used herein means an "unexamined published Japanese patent application").

The valence number of the metal of the ortho-metalation metal complex is not particularly limited, however, in the case of using an iridium, trivalent one is preferable. As to the ligand for the ortho-metalation metal complex, any one can be used as long as it can form the ortho-metalation metal complex. For example, an aryl group substituted nitrogen containing aromatic hetero ring derivative (the aryl group substitution position is on a carbon adjacent to the nitrogen containing aromatic hetero ring nitrogen atom. As the aryl group, for example, a phenyl group, a naphthyl group, an anthracenyl group, a pyrenyl group, or the like, can be presented. As the nitrogen containing aromatic hetero ring, for example, a pyridine, a pyrimidine, a pyrazine, a pyridazine, a quinoline, an isoquinoline, a quinoxaline, a phthalazine, a quinazoline, a naphthyridine, a cinnoline, a perimidine, a phenanthroline, a pyrrole, an imidazole, a pyrazole, an oxazole, an oxadiazole, a triazole, a thiadiazole, a benzimidazole, a benzoxazole, a benzthiazole, a phenantridine, or the like can be presented), a hetero aryl group substituted nitrogen containing aromatic hetero ring derivative (the hetero aryl group substitution position is on a carbon adjacent to the nitrogen containing aromatic hetero ring nitrogen atom. As the hetero aryl group, for example, a group containing the nitrogen containing aromatic hetero ring derivative, a thiophenyl group, a furil group, or the like, can be presented), a 7,8-benzoquinoline derivative, a phosphino aryl derivative, a phosphino hetero aryl derivative, a phosphinoxy aryl derivative, a phosphinoxy hetero aryl derivative, an amino methyl aryl derivative, an amino methyl hetero aryl derivative, or the like can be presented.

Among these examples, an aryl group substituted nitrogen containing aromatic hetero ring derivative, a hetero aryl group substituted nitrogen containing aromatic hetero ring derivative and a 7,8-benzoquinoline derivative are preferable. A phenyl pyridine derivative, a thiophenyl pyridine derivative and a 7,8-benzoquinoline derivative are more preferable. A thiophenyl pyridine derivative and a 7,8-benzoquinoline derivative are further preferable.

As a porphyrin metal complex used in the invention, a platinum complex is preferable, and a divalent platinum complex is more preferable.

As an organic light emitting element with the light emission from a triple exciter observed, a green light emitting element utilizing the light emission from an iridium complex (Ir(ppy)$_3$: Tris-Ortho-Metalated Complex of Iridium (III) with 2-Phenylpyridine) has been reported (Applied Physics Letters 75, 4 (1999)). It is reported that this element achieves an 8% external quantum yield, which exceeds the 5% external quantum yield, which has been said to the limit of the conventional elements.

Next, a light emitting element containing a compound of the invention will be explained. The method for forming an organic layer of a light emitting element containing a compound of the invention is not particularly limited, and the resistance heating deposition, the electron beam, the sputtering, the molecular lamination method, the coating method, the ink-jet method, or the like can be used. In particular, the resistance heating deposition and the coating method are preferable in terms of the characteristics and the production convenience.

A light emitting element of the invention is an element with a light emitting layer or a plurality of organic compound thin films (organic compound layers) including a light emitting layer, formed between a pair of electrodes, that is, an anode and a cathode. In addition to the light emitting layer, a hole injecting layer, a hole transporting layer, an electron injecting layer, an electron transporting layer, a protection layer, or the like may be provided. Moreover, these layers may have other functions. For formation of the layers, various kinds of materials can be used.

A light emitting element of the invention can be produced by coating at least one kind of the polymers represented by the formula (1). In order to provide a light emitting element with the excellent high luminance light emission, high light emission efficiency and durability, the polymer is contained in the organic compound layer of the light emitting element preferably 0.01–100% by mass, more preferably 1–100% by mass.

The node is for supplying a hole to the hole injecting layer, the hole transporting layer, the light emitting layer, or the like. A metal, an alloy, a metal oxide, an electrically conductive compound, or a mixture thereof can be used. A material having a 4 eV or more work function is preferable. Specific examples thereof include conductive metal oxides such as a tin oxide, a zinc oxide, an indium oxide, an indium tin oxide (ITO), metals such as a gold, a silver, a chromium and a nickel, mixtures or laminated products of the metals and the conductive metal oxides, inorganic conductive substances such as a copper iodide and a copper sulfide, organic conductive materials such as a polyaniline, a polythiophene and a polypyrrole, and laminated products thereof with an ITO can be presented. The conductive metal oxides are preferable, and the ITO is particularly preferable in terms of the productivity, the high conductive property, the transparency, or the like.

The film thickness of the anode can be selected optionally depending on the material. In general, those in a range of 10 nm–5 μm are preferable, those in a range of 50 nm–1 μm are more preferable, and those in a range of 100 nm–500 nm are further preferable.

In general, an anode formed as a layer on a soda lime glass, a non-alkaline glass, a transparent resin substrate, or the like is used. In the case a glass is used, as to the material thereof, it is preferable to use a non-alkaline glass in order to reduce the eluted ions from the glass. Moreover in the case a soda lime glass is used, it is preferable to use one with a barrier coating of a silica, or the like applied.

The substrate thickness is not particularly limited as long as the mechanical strength can be maintained sufficiently. In the case a glass is used, in general, those of 0.2 mm or more, preferably those with 0.7 mm or more are used.

For the production of the anode, various methods can be used according to the material. For example, in the case of an ITO, the film can be formed by the electron beam method, the sputtering method, the resistance heating deposition method, the chemical reaction method (sol-gel method, or the like), coating of a dispersion product of an indium tin oxide, or the like. By washing or another process of the anode, the driving voltage of the element can be reduced or the light emitting efficiency can be improved. For example, in the case of an ITO, the UV-ozone process, the plasma process, or the like are effective.

A cathode is for supplying an electron to the electron injecting layer, the electron transporting layer, the light emitting layer, or the like. It is selected in consideration of the close contact property with a layer adjacent to the cathode, such as the electron injecting layer, the electron transporting layer and the light emitting layer, the ionization potential, the stability, or the like. As the material for the cathode, a metal, an alloy, a metal halide, a metal oxide, an electrically conductive compound, or a mixture thereof can be used. Specific examples thereof include alkaline metals (such as an Li, an Na, a K and a Cs) and fluorides thereof, alkaline earth metals (such as an Mg and a Ca) and fluorides thereof, a gold, a silver, a lead, an aluminum, a sodium-potassium alloy or a metal mixture thereof, lithium-aluminum alloys and a metal mixture thereof, magnesium-silver alloys and a metal mixture thereof, and rare earth metals such as an indium and an ytterbium. Those having a 4 eV or more work function are preferable. More preferable are an aluminum, the lithium-aluminum alloys or a metal mixture thereof, the magnesium-silver alloy or a metal mixture thereof, or the like.

The cathode can be provided not only in a single layer structure of the above-mentioned compounds and mixtures, but also in a laminated structure including the above-mentioned compounds and mixtures. The film thickness of the cathode can be selected optionally according to the material. In general, those in a range of 10 nm–5 μm are preferable, those in a range of 50 nm–1 μm are more preferable, and those in a range of 100 nm–500 μm are further preferable.

For the production of the cathode, the electron beam method, the sputtering method, the resistance heating deposition method, the coating method, or the like can be used. It is possible to either deposit a metal alone or deposit two or more components simultaneously. Furthermore, an alloy electrode can be formed by depositing a plurality of metals simultaneously. Moreover, a preliminarily adjusted alloy can be deposited as well. The sheet resistance of the anode and the cathode is preferably low, and a several hundred Ω/□ (Ω/square) or less value is preferable.

As to the material for the light emitting layer, any one can be used as long as a layer having a function of injecting a hole from the anode, the hole injecting layer or the hole transporting layer at the time of applying the electric field as well as injecting an electron from the cathode, the electron injecting layer or the electron transporting layer, a function of moving the injected charge and a function of emitting a light by providing the field for re-coupling the hole and the electron, can be formed. One containing an amine compound of the invention in the light emitting layer can be used preferably, but other light emitting materials can be used as well. For example, various metal complexes represented by metal complexes and rare earth complexes of a benzoxazole derivative, a benzoimidazole derivative, a benzothiaozole derivative, a styryl benzene derivative, a polyphenyl derivative, a diphenyl butadiene derivative, a tetraphenyl butadiene derivative, a naphthal imide derivative, a coumarin derivative, a perylene derivative, a perinone derivative, an oxadiazole derivative, an aldadine derivative, a pyraridine derivative, a cyclopentadiene derivative, a bisstyryl anthracene derivative, a quinacridone derivative, a pyrrolopyridine derivative, a thiadiazoropyridine derivative, a cyclopentadiene derivative, a styryl amine derivative and an aromatic dimethylidine derivative, an 8-quinolynol derivative, and polymer compounds such as a polythiophene, a polyphenylene and a polyphenylene vinylene can be presented. The film thickness of the light emitting layer is not particularly limited. In general, those in a range of 1 nm–5 $\mu$m are preferable, those in a range of 5 nm–1 $\mu$m are more preferable, and those in a range of 10 nm–500 $\mu$m are further preferable.

The method for forming the light emitting layer is not particularly limited, and the resistance heating deposition, the electron beam, the sputtering, the molecular lamination method, the coating method (the spin coating method, the casting method, the dip coating method, or the like), the LB method, the ink-jet method, or the like can be used. The resistance heating deposition and the coating method are preferable.

As the material for the hole injecting layer and the hole transporting layer, any one can be used as long as it has any of a function of injecting a hole from the anode, a function of transporting a hole and a function of blocking an electron injected from the cathode. Specific examples thereof include a carbazole derivative, a triazole derivative, an oxazole derivative, an oxadiazole derivative, an imidazole derivative, a polyaryl alkane derivative, a pyrazoline derivative, a pyrazolone derivative, a phenylene diamine derivative, an aryl amine derivative, an amino substituted chalcone derivative, a styryl anthracene derivative, a fluorenone derivative, a hydrazone derivative, a stilbene derivative, a silazane derivative, an aromatic tertiary amine compound, a styryl amine compound, an aromatic dimethylidine based compound, a porphyrin based compound, a polysilane based compound, a poly(N-vinyl carbazole) derivative, an aniline based copolymer, conductive polymer oligomers such as a thiophene oligomer and a polythiophene, or the like can be presented. The film thickness of the hole injecting layer and the hole transporting layer is not particularly limited. In general, those in a range of 1 nm–5 $\mu$m are preferable, those in a range of 5 nm–1 $\mu$m are more preferable, and those in a range of 10 nm–500 $\mu$m are further preferable. The hole injecting layer and the hole transporting layer can be provided not only in a single layer structure of one or two or more kinds of the above-mentioned materials, but also in a multi-layer structure comprising a plurality of layers of the same composition or different compositions.

As the method for forming the hole injecting layer and the hole transporting layer, the vacuum deposition method, the LB method, the ink-jet method and the method of coating the above-mentioned hole injecting and transporting agent dissolved or dispersed in a solvent (the spin coating method, the casting method, the dip coating method, or the like) can be used. In the case of the coating method, it can be dissolved or dispersed with a resin component. As the resin component, for example, a polyvinyl chloride, a polycarbonate, a polystyrene, a polymethyl methacrylate, a polybutyl methacrylate, a polyester, a polysulfone, a polyphenylene oxide, a polybutadiene, a poly(N-vinyl carbazole), a hydrocarbon resin, a ketone resin, a phenoxy resin, a polyamide, an ethyl cellulose, a vinyl acetate, an ABS resin, a polyurethane, a melamine resin, an unsaturated polyester resin, an alkyd resin, an epoxy resin, a silicone resin, or the like can be presented.

As the material for the electron injecting layer and the electron transporting layer, any one can be used as long as it has any of a function of injecting an electron from the anode, a function of transporting an electron and a function of blocking a hole injected from the cathode. Specific examples thereof include heterocyclic tetracarboxylic acid anhydrides such as a triazole derivative, an oxazole derivative, an oxadiazole derivative, a fluorenone derivative, an anthraquino dimethane derivative, an anthrone derivative, a diphenyl quinone derivative, a thiopyrrane dioxide derivative, a carbidiimide derivative, a fluorenylidene methane derivative, a distyryl pyrazine derivative and a naphthalene perylene, and various metal complexes represented by metal complexes of a phthalocyanine derivative and an 8-quinolinol derivative and metal complexes having as a ligand a metal phthalocyanine, a benzoxazole and a benzothiazole, or the like. The film thickness of the electron injecting layer and the electron transporting layer is not particularly limited. In general, those in a range of 1 nm–5 $\mu$m are preferable, those in a range of 5 nm–1 $\mu$m are more preferable, and those in a range of 10 nm–500 $\mu$m are further preferable. The electron injecting layer and the electron transporting layer can be provided not only in a single layer structure of one or two or more kinds of the above-mentioned materials, but also in a multi-layer structure comprising a plurality of layers of the same composition or different compositions.

As the method for forming the electron injecting layer and the electron transporting layer, the vacuum deposition method, the LB method, the ink-jet method, the method of coating the above-mentioned electron injecting and transporting agent dissolved or dispersed in a solvent (the spin coating method, the casting method, the dip coating method, or the like), or the like can be used. In the case of the coating method, it can be dissolved or dispersed with a resin component. As the resin component, for example, those presented in the case of the hole injecting and transporting layers can be used.

As the material for the protection layer, those having a function of restraining entrance into the element of a substance promoting deterioration of the element, such as a moisture content and an oxygen, can be used. Specific examples thereof include metals such as an In, an Sn, a Pb, an Au, a Cu, an Ag, an Al, a Ti and an Ni, metal oxides such as an MgO, an SiO, an SiO$_2$, an Al$_2$O$_3$, a GeO, an NiO, a CaO, a BaO, an Fe$_2$O$_3$, an Y$_2$O$_3$ and a TiO$_2$, metal fluorides such as an MgF$_2$, an LiF, an AlF$_3$ and a CaF$_2$, a polyethylene, a polypropylene, a polymethyl methacrylate, a polyimide, a polyurea, a polytetrafluoro ethylene, a polychlorotrifluoro ethylene, a polydichlorodifluoro ethylene, a copolymer of a chlorotrifluoro ethylene and a dichlorodifluoro ethylene, a copolymer obtained by copolymerizing a tetrafluoro ethylene and a monomer mixture containing at least one kind of a comonomer, a fluorine containing copolymer having a ring-like structure in a copolymer principal chain, a water absorbing substance with a 1% or more water absorbing ratio and a moisture preventing substance with a 0.1 or less water absorbing ratio.

The method for forming the protection layer is not particularly limited. For example, the vacuum deposition method, the sputtering method, the reactive sputtering method, the MBE (molecular beam epitaxy) method, the cluster ion beam method, the ion plating method, the plasma polymerization method (high frequency excitation ion plating method), the plasma CVD method, the laser CVD method, the thermal CVD method, the gas source CVD method, the coating method and the ink-jet method can be used.

EXAMPLES

Hereinafter, examples of the invention will be explained, however, the invention is not limited thereto.

Example 1

A 25 mm×25 mm×0.7 mm glass substrate with an ITO film formed by a 150 nm thickness (produced by Tokyo Sanyo Shinku corp.) was used as the transparent supporting substrate. The transparent supporting substrate was etched and washed. After spin coating a poly[(3,4-ethylene dioxy)-2,5-thiophene].polystyrene sulfonic acid dispersed product (produced by Bayer Corp.: Baytron P solid component 1.3%), it was vacuum dried at 150° C. for 2 hours so as to form a 100 nm film thickness coating layer. A solvent obtained by dissolving 40 mg of a poly (N-vinyl carbazole (PVK)), 12 mg of a PBD(2-(4'-t-butyl phenyl)-5-(4"-phenyl) phenyl)-1,3,4-oxadiazole) and 1 mg of a coumarin-6 as a light emitting material in 2 ml of a 1,2-dichloro ethane was spin coated thereon as the light emitting layer. The film thickness of the coating film was about 120 nm. After depositing 250 ml of the magnesium:silver=10:1 in a depositing device with a patterned mask (mask with a 5 mm×5 mm light emitting area) placed on the organic thin film 30 nm of a silver was deposited so as to produce an element 101.

For the light emitting characteristics of the element accordingly obtained, a direct current constant voltage was applied to the EL element for emitting a light beam using a source measure unit 2400 type produced by Toyo Technica Corp. so that the luminance thereof was measured by a luminance meter BM-8 produced by Topcon Corp., and the light emission wavelength was measured by a spectrum analyzer PMA-11 produced by Hamamatsu Photonics Corp. The light emission luminance of the element 101 with a 19 V applied voltage was 1,500 cd/m$^2$, and the maximum luminance (Lmax) with the voltage further raised was 3,400 cd/m$^2$.

Moreover, after measurement of the light emission spectrum, the light emission external quantum efficiency obtained by converting the ratio of the value obtained by integrating the light emission energy in the entire spectrum area and the inputted energy value was evaluated. The maximum light emission external quantum efficiency (Qexmax) with respect to the inputted energy was 0.77%.

Elements 102–123 were produced in the same element configuration as that of the element 101 except that the light emitting material of the light emitting layer and the other materials were changed as shown in the table 1. Results of the light emission characteristics of these elements (shown as (initial) in the table), and the light emission characteristics after storing the elements under a nitrogen atmosphere at 60° C. for 1 week (shown as (storage) in the table) are shown in the table 2.

TABLE 1

| Element No. | Light emitting material | Other material |
|---|---|---|
| 101 (Comparative Example) | Coumarin-6 1 mg | PVK 40 mg, PBD 12 mg |
| 102 (Comparative Example) | Coumarin-6 1 mg | PVK 40 mg, Q-1 12 mg |
| 103 (Comparative Example) | Coumarin-6 1 mg | H-1 40 mg, PBD 12 mg |
| 104 (Comparative Example) | Coumarin-6 1 mg | Q-2 52 mg |
| 105 (Present Invention) | Coumarin-6 1 mg | P-1 52 mg |
| 106 (Present Invention) | Coumarin-6 1 mg | P-3 52 mg |
| 107 (Present Invention) | Coumarin-6 1 mg | P-4 52 mg |
| 108 (Present Invention) | Coumarin-6 1 mg | P-5 52 mg |
| 109 (Present Invention) | Coumarin-6 1 mg | P-8 52 mg |
| 110 (Present Invention) | Coumarin-6 1 mg | P-11 52 mg |
| 111 (Comparative Example) | TL-1 1 mg | PVK 40 mg, PBD 12 mg |
| 112 (Comparative Example) | TL-1 1 mg | PVK 40 mg, Q-1 12 mg |
| 113 (Comparative Example) | TL-1 1 mg | H-1 40 mg, PBD 12 mg |
| 114 (Comparative Example) | TL-1 1 mg | Q-2 52 mg |
| 115 (Comparative Example) | TL-1 1 mg | Q-3 52 mg |
| 116 (Comparative Example) | TL-1 1 mg | Q-4 52 mg |
| 117 (Present Invention) | TL-1 1 mg | P-1 52 mg |
| 118 (Present Invention) | TL-1 1 mg | P-3 52 mg |
| 119 (Present Invention) | TL-1 1 mg | P-4 52 mg |
| 120 (Present Invention) | TL-1 1 mg | P-5 52 mg |
| 121 (Present Invention) | TL-1 1 mg | P-8 52 mg |
| 122 (Present Invention) | TL-1 1 mg | P-11 52 mg |
| 123 (Present Invention) | TL-1 1 mg | P-14 52 mg |

TABLE 2

| Element No. | $L_{max}$ (Initital) (cd/m$^2$) | $Q_{exmax}$ (Initital) (%) | $L_{max}$ (Storage) (cd/m$^2$) | $Q_{exmax}$ (Storage) (%) |
|---|---|---|---|---|
| 101 (Comparative Example) | 3400 | 0.77 | 540 | 0.21 |
| 102 (Comparative Example) | 2500 | 0.56 | 520 | 0.20 |
| 103 (Comparative Example) | 1400 | 0.34 | 340 | 0.15 |
| 104 (Comparative Example) | 3100 | 0.73 | 1600 | 0.41 |
| 105 (Present Invention) | 6300 | 1.5 | 5300 | 1.3 |
| 106 (Present Invention) | 6100 | 1.4 | 5000 | 1.3 |
| 107 (Present Invention) | 5900 | 1.4 | 5000 | 1.3 |
| 108 (Present Invention) | 6800 | 1.6 | 5800 | 1.4 |
| 109 (Present Invention) | 6500 | 1.6 | 5700 | 1.4 |
| 110 (Present Invention) | 6000 | 1.5 | 5000 | 1.3 |

TABLE 2-continued

| Element No. | $L_{max}$ (Initial) (cd/m$^2$) | $Q_{exmax}$ (Initial) (%) | $L_{max}$ (Storage) (cd/m$^2$) | $Q_{exmax}$ (Storage) (%) |
| --- | --- | --- | --- | --- |
| 111 (Comparative Example) | 25000 | 8.3 | 5100 | 2.3 |
| 112 (Comparative Example) | 13000 | 5.2 | 7100 | 3.3 |
| 113 (Comparative Example) | 8900 | 3.4 | 3100 | 1.5 |
| 114 (Comparative Example) | 15000 | 5.3 | 8900 | 3.3 |
| 115 (Comparative Example) | 18000 | 5.7 | 9300 | 2.3 |
| 116 (Comparative Example) | 16000 | 5.5 | 8900 | 3.0 |
| 117 (Present Invention) | 34000 | 10 | 25000 | 8.7 |
| 118 (Present Invention) | 32000 | 10 | 23000 | 8.6 |
| 119 (Present Invention) | 37000 | 11 | 28000 | 8.9 |
| 120 (Present Invention) | 35000 | 11 | 26000 | 8.8 |
| 121 (Present Invention) | 30000 | 9.8 | 22000 | 8.2 |
| 122 (Present Invention) | 33000 | 10 | 22000 | 8.2 |
| 123 (Present Invention) | 36000 | 11 | 26000 | 8.6 |

Q-1

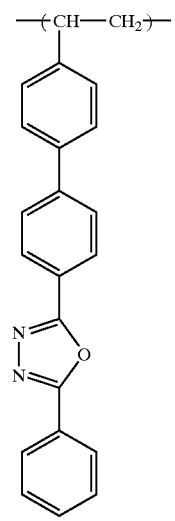

Q-2

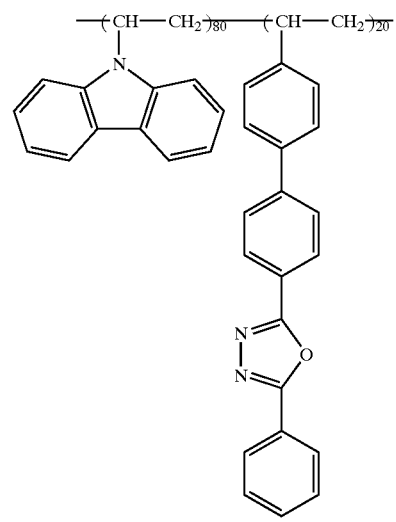

TABLE 2-continued

| Element No. | $L_{max}$ (Initital) (cd/m$^2$) | $Q_{exmax}$ (Initital) (%) | $L_{max}$ (Storage) (cd/m$^2$) | $Q_{exmax}$ (Storage) (%) |
|---|---|---|---|---|

Q-3

[Chemical structure: copolymer with carbazole (N-C$_2$H$_5$) unit (80%) and biphenyl-oxadiazole-phenyl unit (20%)]

Q-4

[Chemical structure: copolymer with carbazole unit (90%) and methyl-biphenyl-oxadiazole-phenyl unit (10%)]

TL-1

[Chemical structure: Ir(ppy)$_3$ complex — tris(2-phenylpyridine)iridium]

From the tables, it was learned that the elements 105–110 using a polymer of the invention provide the excellent light emitting luminance both in the initial stage and after storage compared with the light emitting elements 101–104 using a coumarin-6 as the light emitting material.

Moreover, in the results of the elements 111–123 using a light emitting material capable of emitting a light from the triplet excitation state, in comparison of the comparative examples 111–116 and the elements 117–123 using a polymer of the invention, the light emitting luminance and the light emitting efficiency are both improved dramatically compared with the case of the coumarin-6 so that it was learned that it is effective to use a light emitting material capable of emitting a light from the triplet excitation state in combination with a polymer of the invention in terms of the light emitting luminance and the light emitting efficiency.

It shows that a light emitting element with a high luminance and a high light emitting efficiency can be produced by containing a polymer having a ballast group of the invention. Furthermore, an element with little luminance decline after storage in a high temperature and the excellent durability can be provided.

The entire disclosure of each and every foreign patent application from which the benefit of foreign priority has been claimed in the present application is incorporated herein by reference, as if fully set forth.

What is claimed is:

1. A polymer represented by the following formula (2):

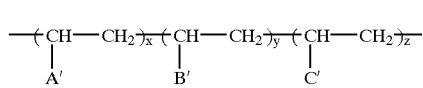
(2)

wherein A' is a substituted or unsubstituted carbazole group bonded with the main chain of the polymer at one of positions 1 through 9 of the carbazole; B' comprises a 1,3,4-oxadiazole unit; C' represents a group having a structure other than A' and B', x, y and z each represents mole fraction (%), x and y each represents 1–99(%), z represents 1–98(%), x+y+z=100(%); and at least one of the A', B' and C' further comprises as a substituent at least one group selected from the group consisting of an alkyl group, an alkoxy group, an ester group, an amide group and a sulfone amide group, each group having 4 to 20 carbon atoms.

2. The polymer of claim 1, wherein the substituent of at least one of the monomer units A', B' and C' is an alkyl group or an alkoxy group, each group having 4 to 20 carbon atoms.

3. The polymer of claim 2, wherein the substituent of at least one of the monomer units A', B' and C' is an alkyl group having 4 to 20 carbon atoms.

4. The polymer of claim 1, wherein the substituent of at least one of the monomer units A', B' and C' is an alkyl group having 8 to 20 carbon atoms.

5. The polymer of claim 1, wherein x is from 50% to 95% and y is from 5% to 50% and z is 0%.

6. The polymer of claim 4, wherein the weight average molecular weight (Mw) of formula (2) is from 1,000 to 10,000,000.

7. The polymer of claim 1, wherein 1,3,4-oxadiazole unit is represented by the following formula:

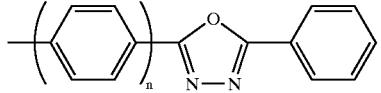

n is 1 or 2.

8. A light emitting element comprising an anode, a cathode and at least one polymer layer between the anode and the cathode, wherein the at least one polymer layer comprises a polymer represented by the following formula (2):

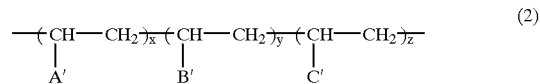
(2)

wherein A' is a substituted or unsubstituted carbazole group bonded with the main chain of the polymer at one of positions 1 through 9 of the carbazole; B' comprises a 1,3,4-oxadiazole unit; C' represents a group having a structure other than A' and B'; x, y and z each represents mole fraction (%), x and y each represents 1–99(%), z represents 1–98(%), x+y+z=100(%), and at least one of the A', B' and C' further comprises as a substituent at least one group selected from the group consisting of an alkyl group, an alkoxy group, an ester group, an amide group and a sulfone amide group, each group having 4 to 20 carbon atoms.

9. The light emitting element of claim 8, which further comprises at least one light emitting material that is capable of emitting a light from a triplet state.

10. The light emitting element of claim 8, wherein the substituent of at least one of the monomer units A', B' and C' is an alkyl group or an alkoxy group, each group having 4 to 20 carbon atoms.

11. The light emitting element of claim 10, wherein the substituent of at least one of the monomer units A', B' and C' is an alkyl group having 4 to 20 carbon atoms.

12. The light emitting element of claim 11, wherein the substituent of at least one of the monomer units A', B' and C' is an alkyl group having 8 to 20 carbon atoms.

13. The light emitting element of claim 8, wherein x is from 50% to 95% and y is from 5% to 50% and z is 0%.

14. The light emitting element of claim 8, wherein the weight average molecular weight (Mw) of formula (2) is from 1,000 to 10,000,000.

15. The light emitting element of claim 8, which further comprises an ortho-metalation metal complex.

16. The light emitting element of claim 15, wherein the ortho-metalation metal complex comprises one of rhodium, platinum, gold, iridium, ruthenium and palladium.

17. The light emitting element claim 8, wherein the 1,3,4-oxadiazole unit is represented by the following formula:

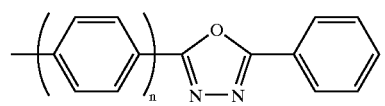

n is 1 or 2.

* * * * *